United States Patent
Nakahara et al.

(10) Patent No.: US 6,863,735 B1
(45) Date of Patent: Mar. 8, 2005

(54) EPITAXIAL GROWTH FURNACE

(75) Inventors: Shinji Nakahara, Gumma (JP); Masato Imai, Gumma (JP); Masanori Mayusumi, Gumma (JP); Kazutoshi Inoue, Gumma (JP); Shintoshi Gima, Gumma (JP)

(73) Assignee: Super Silicon Crystal Research Institute Corp., Annaka (JP)

( * ) Notice: Subject to any disclaimer, the term of this patent is extended or adjusted under 35 U.S.C. 154(b) by 0 days.

(21) Appl. No.: 09/744,363

(22) PCT Filed: Jul. 26, 1999

(86) PCT No.: PCT/JP99/03993

§ 371 (c)(1),
(2), (4) Date: Feb. 21, 2001

(87) PCT Pub. No.: WO00/07228

PCT Pub. Date: Feb. 10, 2000

(30) Foreign Application Priority Data

Jul. 27, 1998 (JP) .............................................. 10-211028

(51) Int. Cl.[7] .............................. C23C 16/00; C23F 1/00; H01L 21/306; B65G 49/07
(52) U.S. Cl. ........................ 118/730; 118/728; 118/729; 118/503; 156/345.51; 156/345.54; 156/345.55; 414/935; 414/941
(58) Field of Search ........................ 156/345.51, 345.54, 156/345.55; 414/935, 941; 118/729, 730, 715, 728

(56) References Cited

U.S. PATENT DOCUMENTS 3,623,712 A * 11/1971 McNeilly et al. .............. 263/41
4,473,455 A * 9/1984 Dean et al. ................... 204/298
4,788,994 A * 12/1988 Shinbara ....................... 134/157
4,793,603 A * 12/1988 Wober et al. ............ 269/254 R
4,854,568 A * 8/1989 Baeza et al. .................. 269/268
4,970,986 A * 11/1990 Anthony et al. ............. 118/724
4,971,676 A * 11/1990 Doue et al. .............. 204/297 R
5,036,794 A * 8/1991 Yamazaki et al. ........ 118/723 E
5,094,885 A * 3/1992 Selbrede ................... 427/248.1
5,447,570 A * 9/1995 Schmitz et al. ............. 118/728
5,458,322 A * 10/1995 Kulkaski et al. ......... 269/254 R
5,587,019 A * 12/1996 Fujie ........................... 118/725
5,700,297 A * 12/1997 Vollaro ....................... 29/25.01
6,106,628 A * 8/2000 Takahashi .................... 118/725
6,262,393 B1 * 7/2001 Imai et al. ................... 219/390
6,287,385 B1 * 9/2001 Kroneberger ............... 118/503

FOREIGN PATENT DOCUMENTS

| EP | 840 358 | * | 5/1998 | ........... H01L/21/00 |
| JP | 60-105246 | * | 6/1985 | |
| JP | 04-320022 | * | 11/1992 | ......... H01L/21/027 |
| JP | 4-324954 | | 11/1992 | |
| JP | 6-267855 | | 9/1994 | |
| JP | 8-181196 | | 7/1996 | |
| JP | 09129553 A | * | 5/1997 | ......... H01L/21/205 |
| WO | WO 99/18599 | * | 4/1999 | |

* cited by examiner

Primary Examiner—Parviz Hassanzadeh
Assistant Examiner—Karla Moore
(74) Attorney, Agent, or Firm—Frishauf, Holtz, Goodman & Chick, P.C.

(57) ABSTRACT

An epitaxial growth furnace is provided for effecting the formation of an epitaxial layer on the surface of a semiconductor wafer by CVD in a reaction chamber of the furnace. The furnace comprises a wafer holder having an opening for exposing a surface area of the wafer which is subject to epitaxial growth, an opening flange adapted for engagement with a chamfered tapered face of a whole peripheral edge of the wafer on the side of said surface area thereof, and a plurality of jaws for detachably engaging with an outer periphery of the wafer on a back surface side of said surface area.

4 Claims, 4 Drawing Sheets

EPITAXIAL GROWTH FURNACE

CROSS REFERENCE TO RELATED APPLICATION

This application is a U.S. National-Phase Application under 37 CFR 371 of International Application No. PCT/JP99/03993 (not published in English) filed Jul. 26, 1999.

TECHNICAL FIELD

The present invention relates to an epitaxial growth furnace for effecting the formation of an epitaxial layer on the surface of a semiconductor wafer and more particularly to a wafer holder for holding the wafer within the furnace.

BACKGROUND ART

Presently, among the known epitaxial growth methods, the H—Si—Cl system CVD (chemical vapor deposition) process has been most widely studied and put in practical applications. The process is such that a silicon source gas is supplied by means of a hydrogen carrier onto a silicon substrate heated to an elevated temperature and a silicon single crystal is deposited and grown on the substrate through the reaction of the H—Si—Cl system. The common silicon source gases include $SiCl_4$, $SiHCl_3$, $SiH_2Cl_2$ and $SiH_4$.

For the purpose of effecting such epitaxial growth, there have been used growth furnace apparatus of the type constructed so that a semiconductor substrate to be processed is held on a susceptor within a sealed chamber and a source gas is supplied into the chamber while heating the semiconductor substrate by a radiation heating system using halogen lamps or infrared lamps, for example. After the semiconductor wafer has been heated in a reference gas atmosphere e.g., hydrogen atmosphere within the chamber of the apparatus, a source gas is newly released into the reference gas and supplied onto the wafer surface so that a reaction gas consisting of a mixture of the reference gas and the source gas is produced and an epitaxial growth layer is formed on the wafer surface.

In this connection, the recent trend has been such that the size of reaction furnaces tends to become greater and bulky unavoidably due to the increase in the diameter of semiconductor wafers. As a result, the growth furnaces now in use for large-diameter wafers are generally of the single wafer processing type. Owing to the single wafer processing, this type has the effect of not only making the reaction chamber itself more compact but also simplifying the designing of heating conditions, gas flow distribution, etc., and ensuring higher uniformity of the epitaxial film characteristics.

While it is of course desirable that an epitaxial growth layer can be efficiently formed on the intended surface area of a semiconductor wafer, in fact the deposition of reaction product can occur on the surface of all the objects which contact with a source gas within the chamber. Such deposition of reaction product on the undesired portions tends to become an obstacle to the production of high-quality wafers.

Particularly, if such reaction product is caused to deposit on the moving parts of a wafer holding mechanism around a semiconductor wafer, there is the danger of the product peeling off and falling on the wafer surface due to the movement of these parts thereby causing particle contamination.

Also, if the source gas is allowed to flow around from the border of the semiconductor wafer to the back side of the wafer, not only there is the danger of an epitaxial growth layer being formed on the wafer back side, but also there is the possibility of the product being deposited on a heating mechanism arranged on the back surface side and causing variations in the amount of heating on the wafer during the epitaxial growth reaction thereby deteriorating the quality of the wafer.

In view of the foregoing deficiencies, it is an object of the present invention to provide an epitaxial growth furnace equipped with at least one semiconductor wafer holding mechanism capable of preventing the deposition of a reaction product which is a cause of particle contamination on the surface of a semiconductor wafer. It is another object of the present invention to provide an epitaxial growth furnace equipped with at least one semiconductor wafer holding mechanism capable of preventing a source gas from flowing around from the border of a semiconductor wafer to its back surface side.

DISCLOSURE OF INVENTION

An epitaxial growth furnace according to the present invention, which effects the formation of an epitaxial layer on the surface of a semiconductor wafer by supplying under a high temperature condition a source gas to a surface area of the semiconductor wafer, said surface area being subject to epitaxial growth within a sealed chamber of the furnace, comprises at least one wafer holder having an opening for exposing said surface area of the wafer, an opening flange adapted for engagement with a chamfered tapered face of a whole peripheral edge of the wafer on the side of said surface area thereof, and a plurality of jaw means adapted for detachably engaging with an outer periphery of the wafer on the back side of said surface area.

In accordance with the present invention, the epitaxial growth furnace is equipped with the wafer holder so designed that a semiconductor wafer is supported by the opening flange adapted for engagement with the whole chamfered tapered face of the border of the wafer on its surface side, and the outer periphery on the wafer back surface side is detachably engaged with the plurality; of jaws thereby holding the wafer in place. In other words, with the wafer holding mechanism of the present invention, its moving parts are the jaws and these moving parts are positioned only on the back surface side of the wafer.

Thus, in accordance with the wafer holder of the present invention, which holds a wafer within the epitaxial growth furnace, even if dust is generated by the movement of the moving parts and even if the reaction product is deposited on these moving parts, the danger of the dust or the exfoliating reaction product falling on and contaminating the wafer surface can be avoided.

In the wafer holder of the present invention, the chamfered tapered face of the border of the wafer on its surface side is supported by the opening flange of a shape corresponding to and engageable with the wafer outer peripheral shape, and this opening flange comes into contact with the whole tapered face on the wafer surface side so that the holder opening is completely closed by the wafer and therefore substantially no space is left between the holder and the peripheral edge of the wafer.

Thus, where a source gas is supplied only to the wafer surface side, the source gas is prevented from flowing around from the surface side to the back side of the wafer through between the holder and the wafer peripheral edge. As a result, there is no possibility of the source gas going round to the wafer back surface side being brought into contact with the heating mechanism arranged in the vicinity of the wafer back surface thereby causing the deposition of a reaction product and making difficult the maintenance of uniform heating conditions, and also there is no danger of deteriorating the quality of the wafer.

As regards a desired construction for source gas supply such that a source gas is supplied only to the surface side of a wafer and it is prevented from flowing around from the holder outer peripheral edge to the wafer back surface side, as for example, a construction is conceivable in which a pair of semiconductor wafers are arranged adjacent to each other so that their surfaces oppose each other parallely within the chamber and a source gas is circulated as a laminar flow only through between the wafers by means of upper and lower supply and exhaust systems. Further, it is possible to construct so that the whole peripheries of two wafers are covered to form an independent reaction space separated from the surroundings and a source gas is exclusively circulated within the reaction space.

In accordance with a preferred aspect of the present invention, the opening flange of the wafer holder comes into contact only with the whole chamfered tapered face of the border of a semiconductor wafer on the side of its surface which is subject to epitaxial growth. The opening flange can also support the wafer through the contact with the tapered face without allowing the slipping out of the wafer to its surface side; in this case, the opening flange does not contact and cover the border of the wafer surface other than the tapered face and thus not only the effective area of the wafer surface adapted for epitaxial layer formation can be increased but also there is no danger of a reaction product depositing on the area covering the periphery of the opening flange and thus causing contamination.

Also, as regards the construction by which the plurality of jaws in the wafer holder of the present invention are allowed to detachably engage with the wafer outer periphery on the back surface side, a simple and convenient one is that which employs springs. In other words, spring means which provide pre-energization toward the center of the opening and detachable actuating means for locking the jaws in released positions against the energization by the spring means.

In order to hold a semiconductor wafer on the holder, the actuating means first bring the jaws into released positions energizing them towards the holder outer periphery against the pre-energization by the spring means and the semiconductor wafer is loaded so as to close the opening from that side of the holder provided with the jaws (the holder back side) while bringing the border chamfered tapered face on the wafer surface side into contact with the flange of the opening. After the loading of the wafer, the energization of the jaws towards the holder outer periphery is released so that the jaws are energized towards the center of the opening to press the peripheral edge on the wafer back side towards the center of the opening and the wafer is held among the jaws thereby holding the wafer in place.

Note that the jaws should preferably be arranged at equal angular intervals along the holder periphery so that the pressing forces against the wafer by the plurality of jaws are uniformly dispersed relative to each other. The reason is that nonuniform pressing by the plurality of jaws results in the application of localized weights on the semiconductor wafer so that if the direction of pressing just coincides with any physically weak portion of the wafer, a stress is applied to the semiconductor wafer with the result that under the high temperature environment during epitaxial growth, there is the danger of causing slip deformation of the crystal thus causing irregularities in the wafer surface, that is, the induction of so-called slip defect.

Also, as regards the arrangement of the jaws, it is most desirable that their positions and number are selected in such a manner that each of the jaws applies a uniform pressing force to a part of the semiconductor wafer having a high mechanical strength. For instance, the semiconductor wafer is generally a silicon wafer substrate cut at the crystal plane (100), and it is well known that in this case the mechanical strength is highest at the positions along the crystal orientation <100>of the surface.

Thus, if the positions of the jaws of the wafer holder relative to the semiconductor wafer are selected so as to correspond to such four parts along the holder periphery that the pressing directions of the respective jaws coincide with the crystal orientation <100>of the semiconductor wafer, the semiconductor wafer is pressed and held among the jaws at least at those parts of the wafer where the mechanical strength is highest physically and therefore the semiconductor wafer can be held more stably. This is especially advantageous in the case of large-diameter semiconductor wafers which are large in weight.

In fact, while the use of two jaws is sufficient, if it is desired to simply hold the semiconductor wafer in place, such two-point support causes the wafer to tend to bend under its own weight and this trend is particularly manifest in the case of wafers of large diameters. Therefore, the wafer holder of the present invention is constructed so as to include at least three jaws. Considering from the design and production point of view, it is convenient to use a construction including three jaws or the previously mentioned construction having four jaws. Of course, it is possible to include five or more jaws and in any case the jaws are arranged at equal angular intervals along the holder periphery.

It is to be noted that where a semiconductor wafer is formed with a chamfered tapered face on the back side periphery in addition to that on the surface side, the contacting portion of each jaw may be formed into a shape having an inclined face corresponding to the tapered faces of the border on the both sides of the wafer thereby making the holding condition of the semiconductor wafer more stable.

Further, in accordance with the wafer holder of the present invention constructed so as to hold the peripheral edge of a semiconductor wafer from the both sides as mentioned previously, the semiconductor wafer can be vertically arranged (placed upright with the wafer surface along the vertical direction) thereby preventing the occurrence of any warp due to its own weight which can cause a crystal defect in the wafer, and also it can be used with upright type systems which are capable of simultaneous epitaxial growth processing of two or more semiconductor wafers and considered to be suitable for large-diameter wafers.

BRIEF DESCRIPTION OF DRAWINGS

FIGS. 3a and 3b show the construction of a wafer holder used in the epitaxial growth furnace of FIG. 1, in which FIG. 3a is its plan view as seen from the back side and FIG. 3b is its cross-sectional view.

FIGS. 4a to 4c show the construction of the jaw actuating means in the wafer holder of FIGS. 3a and 3b, in which FIG. 4a is a partial enlarged plan view as seen from the holder back side, FIG. 4b is a partial cross-sectional view, and FIG.

4c is an enlarged cross-sectional view of the jaw and the associated parts.

BEST MODE FOR CARRYING OUT THE INVENTION

An epitaxial growth furnace according to an embodiment of the present invention has a construction which employs wafer holders each including a plurality of jaws operated by a plurality of spring-type actuating means so as to permit simultaneous formation of epitaxial layers on a pair of semiconductor wafers.

Figure 1:
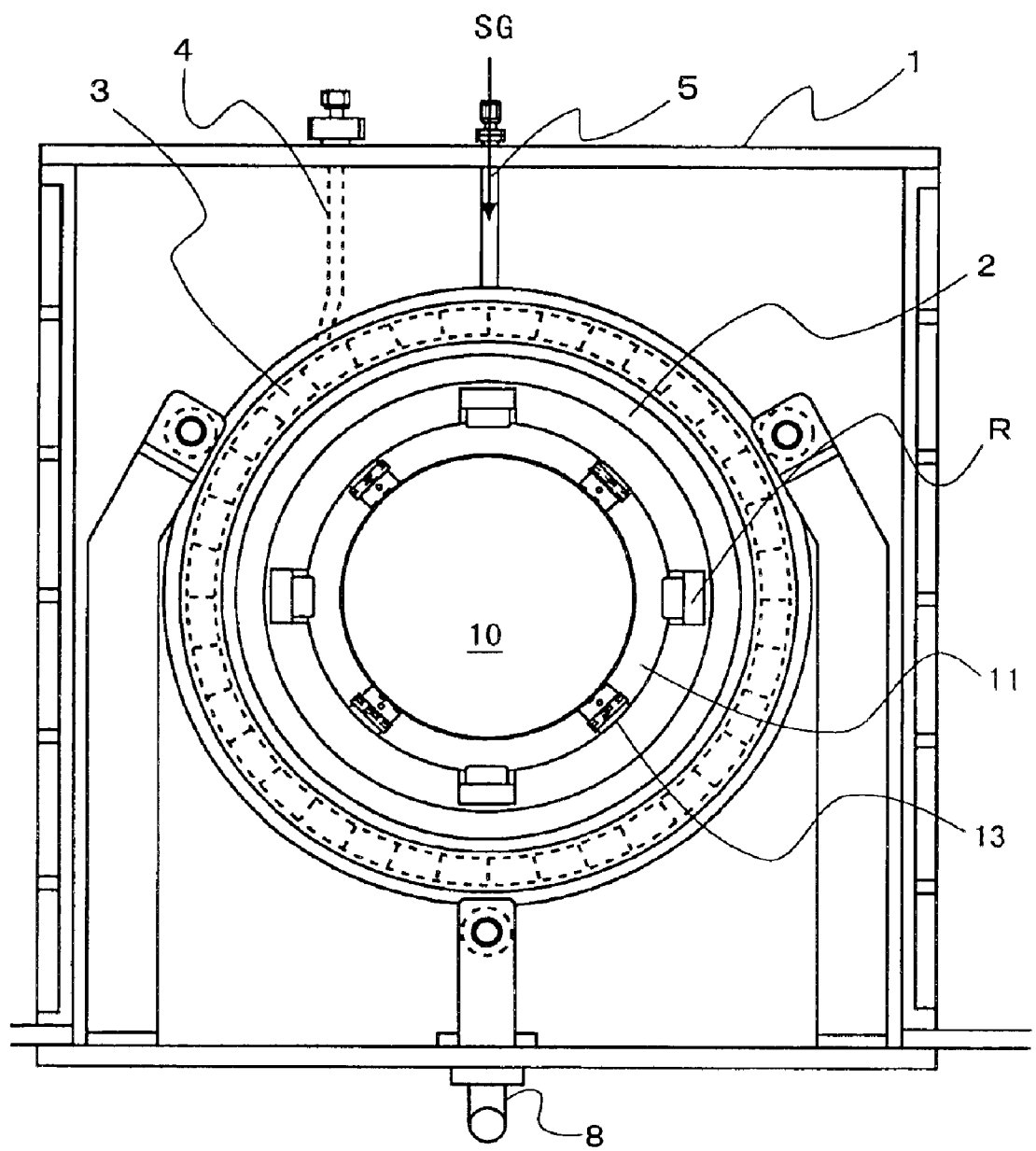
FIG. 1 is a schematic front view showing, as seen from the wafer back surface side, the interior of the chamber of an epitaxial growth furnace according to an embodiment of the present invention.
Figure 2:
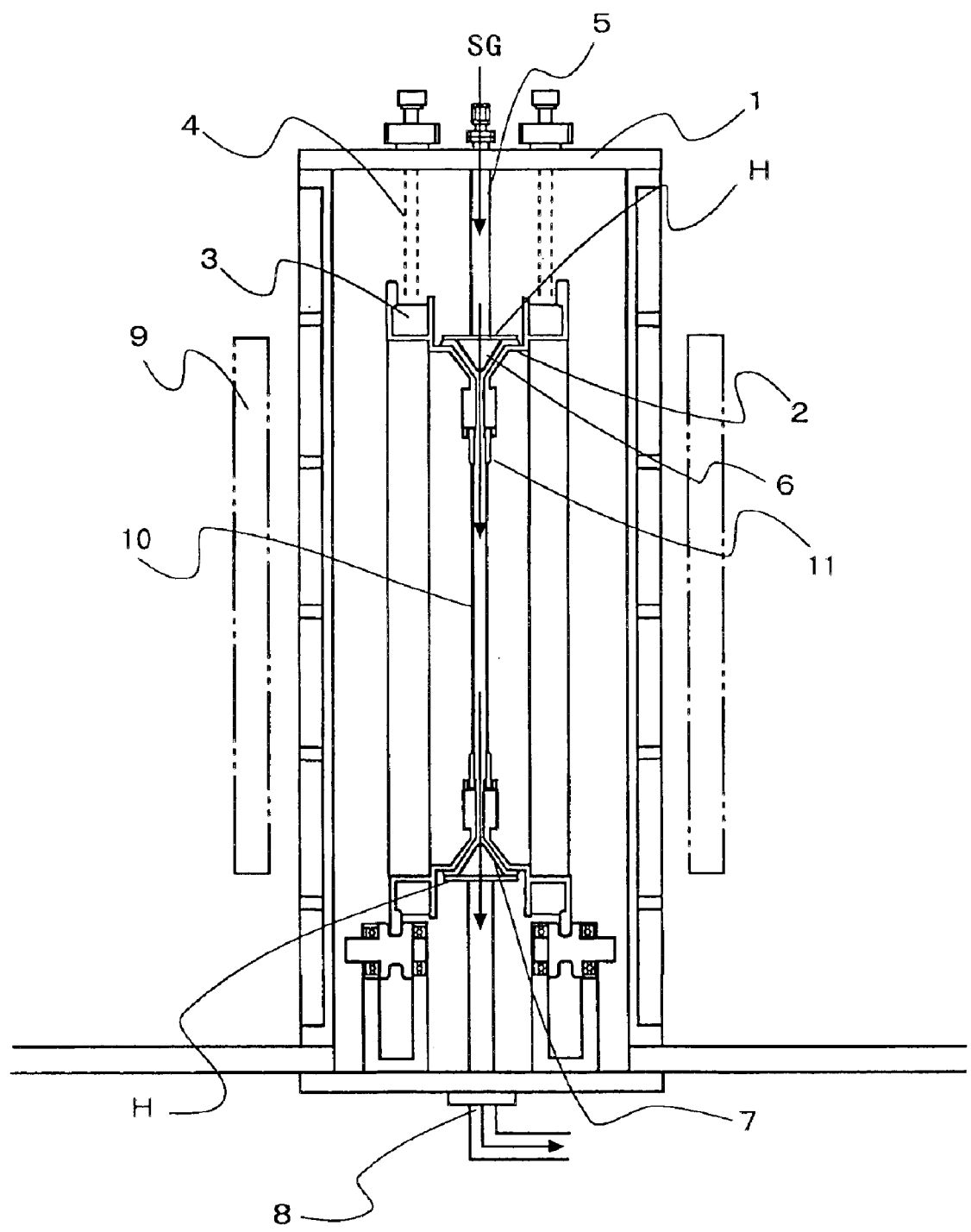
FIG. 2 is a longitudinal sectional view showing the chamber interior of FIG. 1 as seen from the lateral side.

In the epitaxial growth furnace of the present embodiment, a pair of substantially cylindrical drum-type susceptors 2 are rotatably supported within a chamber 1 as shown in the schematic front view of FIG. 1 showing the interior of the chamber as seen from the back surface side of a semiconductor wafer and the central sectional view of FIG. 2 showing the chamber as seen from the lateral side.

Disposed in the respective opposing end-side openings of the cylindrical drums of the susceptors 2 are wafers 10 which are held upright in the vertical direction through wafer holders 11 in such a manner that their respective surfaces subject to epitaxial growth are exposed in mutually opposing positions. The peripheral edge of each susceptor opening corresponds to the outer peripheral shape of the wafer holder 11 and the peripheral edge of the wafer holder 11 is detachably held by a plurality of locking means R so as to close the susceptor opening.

On the other hand, a rotating fin 3 including a plurality of vanes is attached onto the outer peripheral surface of each susceptor 2. The fin 3 is rotated by the supply of gas blown to the vanes from a rotating gas supply pipe 4 so that the cylindrical drum-type susceptor 2 is rotated on a horizontal axis by the rotation of the fin 3 and this rotation causes the semiconductor wafer 10 held in a vertical plane to rotate about the horizontal axis along with the wafer holder 11.

Figure 3A:
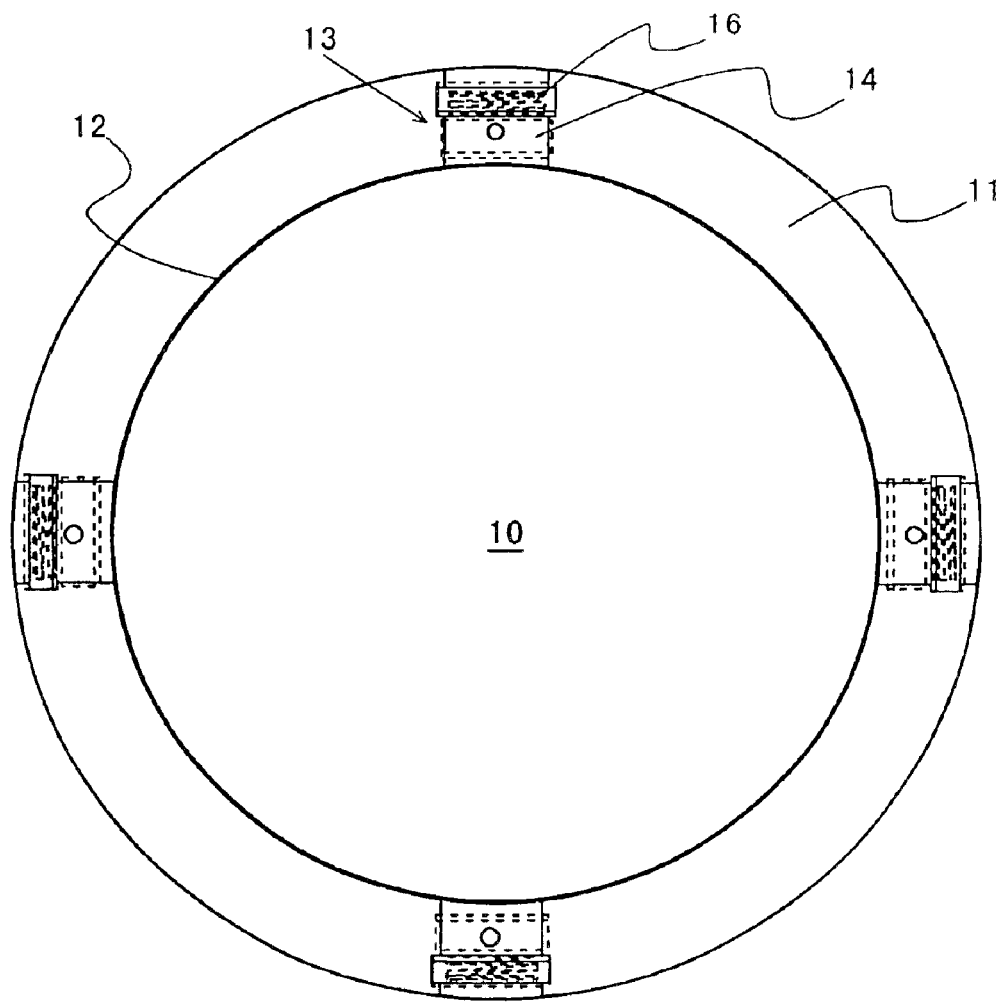
Figure 3B:
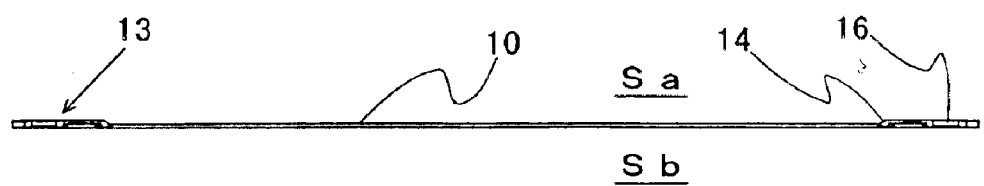
Figure 4A:
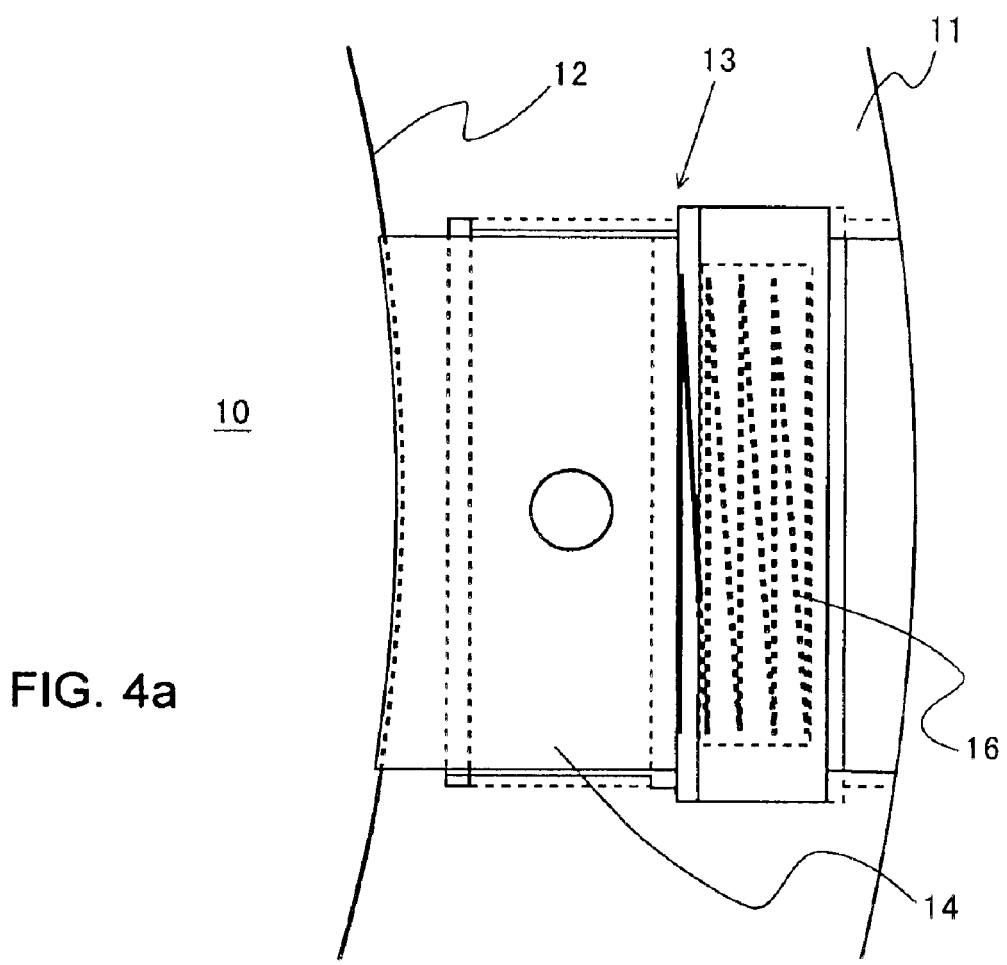
Figure 4B:
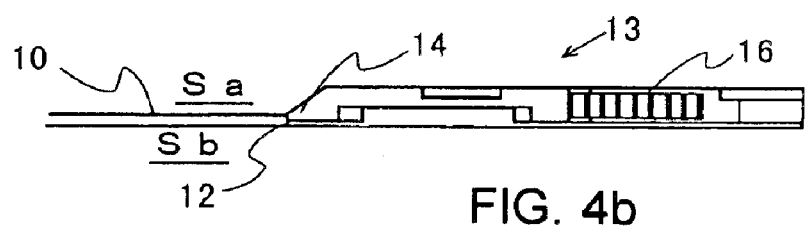
Figure 4C:
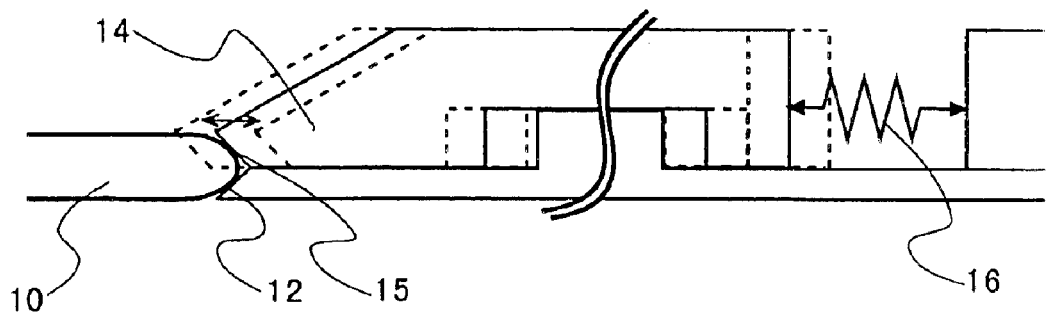

FIGS. 3a and 3b show the construction of the wafer holder 11 used in the epitaxial growth furnace of the present embodiment, in which FIG. 3a is a plan view as seen from the back side and FIG. 3b is a cross-sectional view. FIGS. 4a to 4c show the spring-type actuating means of the wafer holder 11, with FIG. 4a showing a partial enlarged plan view as seen from the back side, FIG. 4b showing a partial sectional view of the actuating means, and FIG. 4c showing a schematic view useful for explaining the operation of the jaw.

As shown in FIGS. 3a, 3b and 4a to 4c, the wafer holder 11 is formed into a ring shape having in its central portion an opening for exposing the surface Sb of the wafer 10 which is subject to epitaxial growth. An opening flange 12 is shaped so that it engages with only the chamfered tapered face of the peripheral edge on the surface side Sb of the wafer 10 so as to contact with its whole periphery and thereby to prevent the wafer 10 from escaping to the surface side. Thus, when the wafer 10 is loaded on the holder 11 with the peripheral edge of the surface side Sb in contact with the opening flange 12, the opening of the holder 11 is closed tightly by the wafer 10.

Also, the wafer-back side Sa of the holder 11 (hereinafter referred to as a holder back side) is provided with four jaw actuating means 13 which are arranged at equal angular intervals. The actuating means 13 are each constructed so that the associated jaw 14 is preliminarily energized towards the center of the holder opening by its spring 16 and the jaw 14 is retracted against the preliminary energization by the spring 16 and locked in this condition thereby attaining a released position. In its free condition, each jaw 14 has its forward end 15 projected inwardly of the opening flange 12.

Thus, when the jaws 14 in their released positions are unlocked after the wafer 10 has been loaded on the holder 11 by bringing its surface side peripheral edge into engagement with the opening flange 12, the forward ends 15 of the Jaws 14 are again moved toward the opening center in response to the energization by the springs 16 and are pressed toward the center from four wafer circumferential directions to hold the peripheral edge on the back side of the wafer 10 thereby holding the wafer 10 in place. Note that with the present embodiment, it is assumed that when loading the wafer 10 on the holder 11, its positioning is effected in such a manner that the pressing direction of each jaw 14 coincides with that orientation of the wafer 10 which is high in mechanical strength, e.g., the crystal orientation <100>of the wafer 10.

On the other hand, where a chamfered tapered face is also formed on the back side peripheral edge of the wafer 10 as shown in FIG. 4c, the jaw ends 15 can each be formed with an inclined face corresponding to the previously mentioned tapered face thereby bringing them into engagement with the wafer peripheral edge more stably.

As mentioned hereinabove, a pair of the holders 11 each holding the wafer 10 can be respectively mounted on the two susceptors 2 within the chamber 1 to position and arrange the two wafers 10 in place within the chamber 1.

In the present embodiment, an annular housing H is provided within the chamber 1 so as to form an isolated separate reaction space between those surfaces of the two wafers 10 which are to be subjected to epitaxial growth and thus a source gas SG is supplied into the reaction space through a nozzle 6 from a source gas supply pipe 5 inserted into the chamber 1 from above it. On the other hand, the downstream portion of the source gas flow supplied into the reaction space is sucked through a nozzle 7 and discharged to the outside of the chamber 1 through a gas discharge pipe 8.

Note that in the present embodiment, within the inner peripheral region of the annular housing H, the gas supply nozzle 6 is formed with an arcuated slit opening extending along substantially the upper half circle of the wafer 10 and the gas suction pipe 7 is formed with an arcuated slit opening extending along substantially the remaining lower half circle of the wafer 10. As the result of this supply and discharge structure between the gas supply nozzle 6 and the gas suction nozzle 7, a laminar flow of the source gas is generated which circulates from above to below within the reaction space.

Thus, when the source gas SG is supplied from above into the separate reaction space between the pair of wafers 10, a laminar flow of the source gas is generated only on the surface side of the wafers 10 to flow along their surfaces and there is no danger of the source gas flowing round to the back side of the wafers 10.

Further, each of the wafer holders 11 of the present embodiment supports the peripheral edge of the wafer 10 by the opening peripheral edge 12 which contacts with the former along its whole circumference and thus there is left between the wafer 10 and the holder 11 no space tending to allow the source gas to go round to the wafer back side.

While, in the course of epitaxial growth, the wafers 10 are heated by radiant heat irradiated onto the wafer back sides through the chamber walls from heaters 9 arranged on the outside of the chamber 1, in the case of the present embodiment, there is no danger of the source gas going round to the wafer back sides and causing the deposition of a reaction product on the inner wall of the chamber 1 which corresponds to the wafer back side regions so that during the process of the growth reaction a constant amount of radiant heat irradiation is always maintained thereby avoiding any deterioration of the wafer due to variations in the amount of heating.

As described hereinabove, in accordance with the wafer holder of the present embodiment, the actuating means for the jaws constituting moving parts for holding a semiconductor wafer are placed on the back side of the wafer so that if a source gas is caused to flow only onto the wafer surface side, the source gas does not contact with the actuating means, etc., and there is caused no deposition of a reaction product tending to cause particle contamination.

In addition, even if the reaction product is deposited on the actuating means, etc., so that the reaction product peels off during a wafer removing operation or the like, there is no danger of the reaction product falling as particles on the surface side of the wafer thereby contaminating the wafer having an epitaxial layer formed thereon. Also, there is no danger of falling on the wafer surface side of any dust caused in the actuating means by the movement.

Note that while the above-mentioned embodiment shows the wafer holders of the type including the four jaws and the four actuating means, the present invention is not limited thereto and any other construction can be used provided that it includes a plurality of jaws arranged at equal angular intervals on each holder.

Further, while the above-mentioned embodiment is constructed so that the flow of a source gas supplied into the reaction space is directed from above to below, it can of course be so constructed that a source gas is directed to flow from below to above.

Still further, a reference gas for epitaxial growth reaction, e.g., hydrogen gas or inert gas can be used as the gas required for rotating the fins 3. Also, if this fin rotating gas is concurrently used for cooling the cylindrical drum-type susceptors 2, the temperature of the susceptors 2 can be maintained low with the result that not only the heaters can be arranged in such positions, i.e., within the susceptors (drums), which are very close to the respective wafers 10 thus ensuring efficient heating of the wafers 10, but also the construction of the apparatus as a whole can be made more compact.

We claim:

1. An epitaxial growth furnace comprising:
   a sealed chamber;
   a pair of wafer holders for holding a pair of semiconductor wafers within said chamber; and
   means for rotating each of said wafer holders within said chamber,
   wherein formation of an epitaxial layer on a surface of each of said wafers is effected by supplying under a high temperature condition a source gas to a surface area of each of said wafers;
   wherein said wafer holders are rotatably supported at the peripheral thereof within said chamber and adapted to arrange said pair of wafers in such a manner that the wafers are disposed in mutually opposing positions with each said surface area adjacent to and parallel with each other so that a reaction chamber is formed between said wafers;
   wherein said surface areas are subject to epitaxial growth within said reaction chamber;
   wherein each of said wafer holders comprises:
      an opening for exposing one of said surface areas of the wafers to said reaction chamber;
      an opening flange adapted for engagement with a chamfered tapered face of a whole peripheral edge of one of said wafers on a side of said surface area thereof;
      a plurality of jaws for detachably engaging with an outer periphery of one of the wafers on a back surface side of said surface area thereof;
      a plurality of springs for respectively thrusting said jaws toward a center of said opening; and
      detachable actuating means for locking each of said jaws in a released position against respective thrust forces from said springs;
      wherein said jaws, said springs and said detachable actuating means are positioned only on said back surface side of each of said wafers, and
   wherein said means for rotating each of said wafer holders comprises:
      a rotating fin including a plurality of vanes attached onto the outer peripheral of each of said wafer holders; and
      rotating gas supply means for blowing a fin rotating gas to said vanes to cause said wafers to be rotated about a rotation axis along with each of said wafer holders within said chamber.

2. An epitaxial growth furnace according to claim 1, wherein the opening flange of each of said wafer holders is adapted to contact only with the chamfered tapered face of the whole peripheral edge of one of said wafers on the side of said surface area thereof which is subject to epitaxial growth.

3. An epitaxial growth furnace according to claim 2, wherein each of said jaws includes an inclined face corresponding to the chamfered tapered face of the peripheral edge of one of the wafers on said back surface side thereof.

4. An epitaxial growth furnace according to claim 1, wherein said pair of wafer holders are adapted for vertical arrangement of said pair of semiconductor wafers so that the wafers are placed upright with each wafer surface vertically arranged in the reaction chamber.

* * * * *